United States Patent
Irsigler et al.

(10) Patent No.: US 9,496,364 B2
(45) Date of Patent: Nov. 15, 2016

(54) FIELD EFFECT SEMICONDUCTOR COMPONENT AND METHODS FOR OPERATING AND PRODUCING IT

(71) Applicant: Infineon Technologies AG, Neubiberg (DE)

(72) Inventors: Peter Irsigler, Obernberg/Inn (AT); Johannes Georg Laven, Taufkirchen (DE); Hans-Joachim Schulze, Taufkirchen (DE); Helmut Strack, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/754,907

(22) Filed: Jun. 30, 2015

(65) Prior Publication Data
US 2015/0380511 A1 Dec. 31, 2015

(30) Foreign Application Priority Data

Jun. 30, 2014 (DE) .......................... 10 2014 109 147

(51) Int. Cl.
| | |
|---|---|
| *H01L 29/51* | (2006.01) |
| *H01L 29/78* | (2006.01) |
| *H01L 29/739* | (2006.01) |
| *H01L 29/66* | (2006.01) |
| *H01L 29/16* | (2006.01) |
| *H01L 29/20* | (2006.01) |
| *H03K 17/687* | (2006.01) |

(52) U.S. Cl.
CPC .......... *H01L 29/516* (2013.01); *H01L 29/513* (2013.01); *H01L 29/517* (2013.01); *H01L 29/6684* (2013.01); *H01L 29/66333* (2013.01); *H01L 29/66712* (2013.01); *H01L 29/7395* (2013.01); *H01L 29/7802* (2013.01); *H01L 29/78391* (2014.09); *H01L 29/1608* (2013.01); *H01L 29/2003* (2013.01); *H03K 17/687* (2013.01)

(58) Field of Classification Search
None
See application file for complete search history.

(56) References Cited

U.S. PATENT DOCUMENTS

| | | | | |
|---|---|---|---|---|
| 4,896,199 | A * | 1/1990 | Tsuzuki | .................. H01L 23/34 257/328 |
| 5,307,305 | A * | 4/1994 | Takasu | .................... G11C 11/22 257/411 |
| 6,392,859 | B1 * | 5/2002 | Ohshima | ............. H01L 27/0248 257/E27.112 |
| 2003/0113972 | A1 | 6/2003 | Hayashi et al. | |
| 2004/0224188 | A1 * | 11/2004 | Kijima | .................. B82Y 30/00 428/701 |
| 2007/0187667 | A1 * | 8/2007 | Halilov | .................. B82Y 10/00 257/15 |
| 2009/0152607 | A1 | 6/2009 | Tanaka et al. | |
| 2011/0186927 | A1 | 8/2011 | Kawaguchi et al. | |
| 2013/0092940 | A1 | 4/2013 | Tezuka et al. | |
| 2014/0001480 | A1 | 1/2014 | Otremba et al. | |
| 2014/0134812 | A1 | 5/2014 | Kim et al. | |

FOREIGN PATENT DOCUMENTS

DE 202006005725 U1 8/2007

\* cited by examiner

*Primary Examiner* — Benjamin Sandvik
(74) *Attorney, Agent, or Firm* — Eschweiler & Associates, LLC

(57) ABSTRACT

In accordance with one component, a power field effect transistor is proposed, including a substrate, a channel, a gate electrode, and a gate insulator. The gate insulator is arranged at least partly between the gate electrode and the channel and includes a material having a hysteresis with respect to its polarization, such that a switching state of the transistor produced by a voltage applied to the gate electrode is maintained after the voltage has been switched off. Furthermore, a half-bridge circuit is proposed, including a high-side transistor in accordance with the construction according to the disclosure, and a low-side transistor, and also methods and circuits for driving.

19 Claims, 4 Drawing Sheets

FIELD EFFECT SEMICONDUCTOR COMPONENT AND METHODS FOR OPERATING AND PRODUCING IT

CROSS-REFERENCE TO RELATED APPLICATIONS

This application claims priority to Chinese Application No. 102014109147.7, filed on Jun. 30, 2014, and incorporated herein by reference in its entirety.

FIELD

Embodiments of the present disclosure relate to field effect semiconductor components, in particular to vertical field effect semiconductor transistors, and to production methods for field effect semiconductor components.

BACKGROUND

Semiconductor transistors, in particular field effect-controlled semiconductor transistors such as n-metal-oxide semiconductor field effect transistors (MOSFETs) are used for a variety of applications, including in particular as switches in power supplies and power converters, electric automobiles, air-conditioning systems and also stereo systems.

In the case of field effect transistors, a voltage with respect to the source has to be applied to the gate in order to keep the transistor in the switched-on state. In the case of application in a bridge circuit (H-bridge or half-bridge), in the case of the upper (high-side) transistor here said voltage has to be generated separately, for example, by means of a charge pump (bootstrap) and drive electronics, or by means of a galvanically isolated dedicated power supply for the driving. The drive signal is typically coupled into the drive electronics for the upper gate circuit via components having high dielectric strength, such as optocouplers, for example. Such solutions have the disadvantage that they require a multiplicity of additional components for implementation, which constitutes a disadvantage from many different standpoints, in particular with regard to costs and durability and also the higher susceptibility to faults and failure exhibited by these solutions.

Therefore, there is a need for improved field effect semiconductor components and improved production methods for field effect semiconductor components.

SUMMARY

In accordance with one embodiment, a power field effect transistor is proposed, comprising a substrate, a channel, a gate electrode, and a gate insulator. The gate insulator is arranged at least partly between the gate electrode and the channel and comprises a material having a hysteresis with respect to its polarization, such that a switching state of the transistor produced by a voltage applied to the gate electrode is maintained after the voltage has been switched off.

In accordance with a further embodiment, a half-bridge circuit is proposed, comprising a high-side transistor and a low-side transistor, wherein the high-side transistor comprises a substrate, a channel, a gate electrode, and a gate insulator. In this case, the gate insulator is arranged at least partly between the gate electrode and the channel and comprises a material having a hysteresis with respect to its polarization, such that a switching state of the high-side transistor produced by a voltage applied to the gate electrode is maintained after the voltage has been switched off.

In accordance with a further embodiment, a method for producing a field effect transistor is proposed. The method comprises providing a substrate, producing a p-type body region, producing a gate insulator, fitting a gate electrode, and contacting the p-type body region. In this case, the gate insulator comprises a material having a hysteresis with respect to its polarization.

In accordance with a further embodiment, a method for driving a power transistor is proposed, the power transistor comprising a drift zone, a channel, a gate electrode, and a gate insulator, wherein the gate insulator is arranged at least partly between the gate electrode and the channel and comprises a material having a hysteresis with respect to its polarization, such that a switching state of the transistor produced by a voltage applied to the gate electrode is maintained after the voltage has been switched off. The method comprising a first voltage pulse having a first polarity puts the power semiconductor into a permanent, at least partly turned-on state, and a second voltage pulse having an inverse polarity with respect to the first polarity partly or completely cancels the degree of turn-on, wherein the degree of turn-on and the degree of reduction thereof are in one embodiment controllable by the amplitude of the first and second voltage pulses.

Further features and advantages will become apparent to the person skilled in the art upon reading the following detailed description and considering the figures.

BRIEF DESCRIPTION OF THE DRAWINGS

The component parts in the figures are not necessarily true to scale, emphasis being placed rather on the elucidation of the basic concepts of the disclosure. Moreover, in the figures, identical reference numerals designate corresponding parts. In the figures.

DETAILED DESCRIPTION

Figure 1:
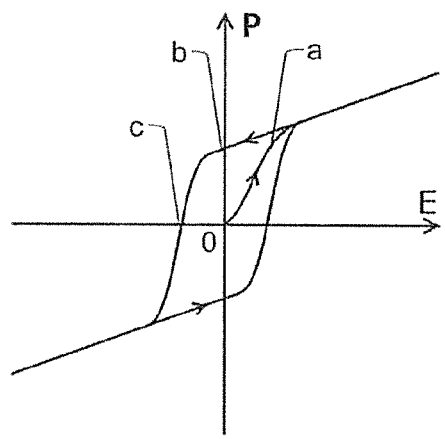
FIG. 1 schematically shows a hysteresis of the polarization of a ferroelectric substance.

In the following detailed description, reference is made to the figures, which are part of this document and which illustratively represent specific embodiments in which the disclosure can be realized in practice. Direction indications such as "at the top", "at the bottom", "at the front", "at the back", "front", "rear" etc., are used with reference to the described orientation of the figure(s). Since component parts of embodiments can be positioned in a series of different orientations, the direction indications are used for illustration purposes and are in no way restrictive. It is pointed out that further embodiments can be used and structural or logical modifications can be made, without departing from the scope of the disclosure. The following detailed description should therefore not be interpreted in a restrictive sense and the scope of the present disclosure is determined by the claims. In this context, it is additionally pointed out that features or feature combinations, e.g. materials or the combination thereof and/or the arrangement of zones, which are disclosed explicitly only with reference to a device in the description, drawings and/or in the claims, for the person skilled in the art also concomitantly disclose corresponding features or feature combinations of the associated production method, unless indicated otherwise. Analogously, for the person skilled in the art, features or feature combinations which are disclosed explicitly only with reference to a production method in the description, drawings and/or in the claims also disclose corresponding features or feature combinations of the device produced.

Various embodiments will now be discussed in detail, one or more examples of which are illustrated in the figures. Each example is given for explanation purposes and is not understood as a restriction of the disclosure. By way of example, features illustrated or described as part of one specific embodiment can be used in the case of or in association with other embodiments, thus resulting in a further embodiment. The present disclosure is intended to include such modifications and variations. The examples are described using a specific language, which should not be interpreted as a restriction of the scope of the appended claims. The drawings cannot be true to scale and serve only for illustrative purposes. For reasons of clarity, identical elements or production steps in the different drawings have been designated by the same reference signs, unless indicated otherwise.

In the context of this description, the expression "horizontal" is intended to denote a direction which extends substantially parallel to a first or horizontal surface of a semiconductor substrate or semiconductor body. This can be the surface of a wafer or chip, for example.

In the present description, it is assumed that a second surface of a semiconductor substrate or semiconductor body is formed by a lower or rear-side surface (rear side), which is typically planar and parallel to the first surface.

In the context of this description, the expression "vertical" is intended to denote a direction which is substantially at right angles to the first surface and/or second surface, i.e. is substantially parallel to a direction of a normal to the first surface and/or a direction of a normal to the second surface of the semiconductor substrate or semiconductor body. The terms "above" and "below" describe the relative arrangement of one structural feature in relation to another structural feature with regard to the vertical direction.

In this patent specification, n-doped semiconductor zones are designated as semiconductor zones of the first conduction type, while p-doped semiconductor zones are designated as semiconductor zones of the second conduction type. As an alternative thereto, the semiconductor components can be embodied with opposite doping relations, such that the first conduction type can correspond to a p-type doping and the second conduction type can correspond to an n-type doping. Furthermore, in some figures relative doping concentrations are indicated by a "−" or "+" being appended to the doping type. By way of example, "n" denotes a doping concentration that is less than the doping concentration of an "n"-type doping zone, while an "n$^+$"-type doping zone has a higher doping concentration than the "n"-type doping zone. If the relative doping concentration is indicated, that does not mean, however, that doping zones having the same relative doping concentration must have the same absolute doping concentration, unless indicated otherwise. By way of example, two different n$^+$-type doping zones can have different absolute doping concentrations. The same applies, for example, to an n$^+$-type doping zone and a p$^+$-type doping zone.

Specific embodiments described in this patent specification are directed in particular, but not exclusively, to field effect semiconductor components, in particular to field effect semiconductor transistors, such as vertical MOSFETs, and production methods therefor, and also to IGBTs and the production methods thereof.

Typically, a vertical power MOSFET is involved comprising a source metallization arranged on the top side, and comprising an insulated gate electrode arranged in the vicinity of the top side, typically in trenches between the semiconductor mesas, and comprising a drain metallization arranged on an oppositely arranged rear side. The metallizations typically also provide corresponding terminals, for example in contact area zones. The vertical semiconductor power transistor typically includes in an active zone a plurality of cells, for example MOSFET cells, for carrying and/or controlling a load current. Furthermore, as viewed from above, the active area can be surrounded at least partly by at least one edge termination structure.

In the context of the present description, the expression "metallization" is intended to describe a zone or a layer having metallic or almost metallic properties in relation to the electrical conductivity. A metallization can be in contact with a semiconductor zone and thus form an electrode, a contact area (pad) and/or a terminal of the semiconductor component. The metallization can consist of or comprise a metal such as Al, Ti, W, Cu and Co, but can also be produced from a material having metallic or almost metallic properties in relation to the electrical conductivity, such as heavily n- or p-doped poly-Si, TiN or an electrically conductive silicide such as $TaSi_2$, $TiSi_2$, PtSi, $CoSi_2$, $WSi_2$ or the like. The metallization can also comprise different electrically conductive materials, for example a stack of said materials.

The expression "edge termination structure", as used in the present patent specification, is intended to describe a structure which provides a transition zone in which the high electric fields around an active zone of the semiconductor component gradually change to the potential at the edge of the component and/or to a reference potential such as ground. The edge termination structure can reduce the field intensity in the vicinity of a pn junction, for example, by distributing the electric field lines over a termination zone.

In the context of this patent specification, the expression "power semiconductor component" is intended to describe a semiconductor component on an individual chip having high-voltage and/or high-current control or switching capability. In other words: power semiconductor components are intended for high currents, typically in the amperes range having a lower limit of approximately 1 ampere, and/or high voltages of above approximately 10 V or even above approximately 500 V. In the context of the present document, the terms "power semiconductor component", "power semiconductor device" and "power transistor" are used synonymously.

In the context of this patent specification, the expression "field effect" is intended to denote the formation—mediated by an electric field—of a conductive "channel" of a first conduction type and/or the control of the conductivity and/or form of the channel in a semiconductor zone of a second conduction type, typically a body zone of the second conduction type. On the basis of the field effect, the channel zone forms and/or controls a unipolar current path between a source zone of the first conduction type adjoining the body zone and a drift zone of the first conduction type adjoining the body zone. The drift zone can be in contact with a more highly doped drain zone of the first conduction type.

The drain zone is in ohmic contact with a drain metallization. The source zone and the body zone are in ohmic contact with a source metallization. In the context of the present document, the expression "in ohmic contact" is intended to denote the fact that an ohmic current path is present between corresponding elements or sections of a semiconductor component if no voltages or only low test voltages are applied to and/or across the semiconductor component. In the context of this patent specification, the expressions "in electrical contact", "electrically connected" and "in ohmic contact" are used synonymously.

In context of the present patent specification, the term "MOS" (metal-oxide semiconductor) should be understood as inclusive of the more general term "MIS" (metal insulator semiconductor). By way of example, the term MOSFET (metal-oxide semiconductor field effect transistor) should be understood such that it also includes field effect transistors (FETs) having a gate insulator that is not an oxide, i.e. the expression MOSFET is used in the more general meaning of IGFET (insulated gate field effect transistor) or MISFET (metal insulator semiconductor field effect transistor).

In the context of the present patent specification, the expression "switch" is intended to describe a semiconductor structure, typically a power MOSFET or a power IGBT, which is configured such that it can carry a load current, typically in the amperes range, and can interrupt the load current.

In the context of the present patent specification, the expression "gate electrode" is intended to denote an electrode which is adjacent to and insulated from the body zone and is configured such that suitable driving of the gate electrode makes it possible to form and/or control a channel zone between the source zone and the drift zone through the body zone.

In the context of the present patent specification, the expressions "Curie temperature" and "defined limit temperature" are used synonymously.

Hereinafter, embodiments relating to semiconductor components and production methods for forming semiconductor components are principally explained with reference to silicon (Si) semiconductor components. Accordingly, a monocrystalline semiconductor zone or a monocrystalline semiconductor layer is typically a monocrystalline Si zone or Si layer. However, it should be pointed out that the semiconductor body can be produced from any semiconductor material suitable for producing a semiconductor component. Examples of such materials include in particular elemental semiconductor materials such as silicon (Si) or germanium (Ge), compound semiconductor materials of group IV such as silicon carbide (SiC) or silicon-germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe), to name just a few. The abovementioned semiconductor materials are also designated as homojunction semiconductor materials. If two different semiconductor materials are combined, a heterojunction semiconductor material is formed. Examples of heterojunction semiconductor materials include in particular, without being restricted thereto, aluminum gallium nitride(AlGaN)-aluminum gallium indium nitride(AlGaInN), indium gallium nitride(InGaN)-aluminum gallium indium nitride(AlGaInN), indium gallium nitride(InGaN)-gallium nitride (GaN), aluminum gallium nitride(AlGaN)-gallium nitride (GaN), indium gallium nitride(InGaN)-aluminum gallium nitride(AlGaN), silicon-silicon carbide ($Si_xC_{1-x}$) and silicon-SiGe heterojunction semiconductor materials. At the present time, Si, SiC, GaAs and GaN materials are principally used for power semiconductor applications. If the semiconductor body comprises a material having a high band gap (>2 eV), such as SiC or GaN, which has a high breakdown field strength or a high critical avalanche field strength, the doping of the corresponding semiconductor zones can be chosen to be higher, which reduces the ON state resistance $R_{ON}$, which hereinafter is also designated as the on resistance $R_{ON}$.

Example embodiments generally relate to power transistors in which a channel is driven by a gate with a gate insulator comprising ferroelectric dielectrics. The materials or material pairings used for the gate insulator are selected here such that they have a sufficient hysteresis behavior with respect to the polarization. This relationship is shown in FIG. 1. From the ground state, that is to say the unpolarized state 0, the electrical polarization of the gate dielectric rises with rising externally applied field strength E (section a). As soon as the external field strength E, that is to say the applied field, is then reduced to zero again, the polarization of the gate dielectric is maintained (point b), however, until a field with opposite direction of a certain strength −E is applied (point c).

In the present disclosure, however, a dielectric storage medium is used for the electric field in the gate. A ferroelectric dielectric such as e.g., in a non-limiting way, BaTiO3 stores the last polarization state striven for by virtue of the hysteresis present in this material during the charging and discharging process. The power transistor, although without voltage at the gate electrode, then remains in the last switching state defined by an applied gate voltage until a new discharging/charging pulse arrives at the gate or the gate electrode. In other words, the power transistor remains switched on or off over an arbitrary length of time even without gate voltage being present. Only a corresponding charging/discharging pulse changes the switching state of the power transistor. On account of this behavior, such a component requires only a simple transformer for driving, such that the drive electronics particularly for use in break circuits are very simple. A further advantage of such gate materials having the property of ferroelectrics is that they become paraelectric at a temperature above the Curie point and thus jump back to a largely polarization-free ground state. After the jump to the ground state at the gate, therefore, the transistor then no longer has an electric field, and automatically switches off. Since the dielectric constant also greatly decreases in the paraelectric state, the device can then no longer be switched on until a temperature below the Curie point is reached. These two effects result in a particularly robust device. They also simplify the predictive measures for the case of a short circuit and under overcurrent conditions, which results in a further reduction of outflow and costs for the system.

The Curie temperature and the dielectric constant epsilon of the gate insulator can be set by means of the mixture of the materials or the material constituents such that the Curie temperature lies in a defined, desired temperature range. In further example embodiments, said temperature range is typically between 150° C. and 250° C.

For an application as short-circuit protection in power MOSFETs or IGBTs, operation with a constant-voltage source in the on operating state is also possible, which corresponds to conventional gate driving. Just by virtue of the decrease in the dielectric constant when the Curie temperature is exceeded, the device can undergo transition to a safe state despite the continuing presence of an on operating potential at the gate driving. Given an appropriate design, the n- or p-channel can be completely closed, or else only partly closed, when the Curie temperature is exceeded. This last can reduce the short-circuit current to an extent such that a short-circuit-resistant, robust device results. This additionally allows the design of a short-circuit-resistant power transistor having a comparatively high saturation current. This results from the fact that, in example embodiments, the overload protection triggers in a temperature-dependent manner as a result of the Curie temperature dependence of the gate insulator dielectric and is not current-controlled. Consequently, short-term overcurrent spikes not achieved here before can be realized, for instance maximum short-term operating currents of more than four times the nominal current, as long as the device temperature remains below the set Curie temperature during the current spike. The entire short-circuit energy remains below the critical range in this case. In example embodiments, the different dielectric constant of the gate insulator also enables a higher p-type body doping with retained threshold voltage, as a result of which the latch-up strength of the power semiconductors and thus also the resistance to cosmic radiation can be significantly increased.

Figure 2:
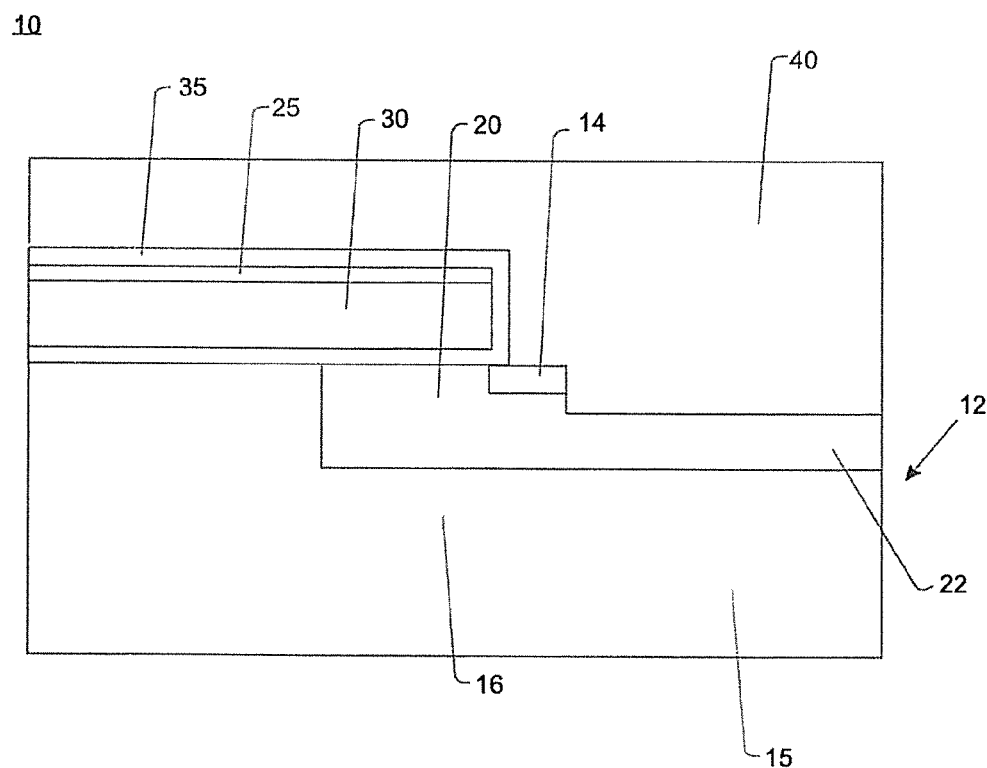
FIGS. 2 and 3 show vertical cross sections through field effect semiconductor components in accordance with embodiments.

FIG. 2 shows an example, non-limiting power transistor 10 in accordance with example embodiments, a MOSFET or MISFET. A weakly p-doped silicon single crystal, the substrate 12, serves as basic material. Two heavily n-doped zones are incorporated into the substrate 12, the zones forming the source 14 and drain 16, respectively, with the source electrode 40. An insulating layer 35 is then applied above a partial region of the interspace remaining therebetween, the p-type body region 22. A dielectric comprising the ferroelectric gate insulator 30 isolates the overlying metallic or quasi-metallic gate electrode 25 from the p-type body region 22 comprising the channel 20. A metal, for instance aluminum, or typically n+- or p+-doped (degenerate) polysilicon is used as the material of the gate electrode 25. The vertical power transistor is shown; the technology described is also applicable to horizontal power semiconductors. In principle, the concept of the ferroelectric gate insulator 30 can be applied to any power semiconductor which switches by way of the field effect, where no specific, device-dependent technical obstacles obstruct that.

As a result of the electric field, in the substrate 12 minority carriers (electrons in the case of p-type silicon) migrate to the depletion layer and recombine with the majority carriers (defect electrons in the case of p-type silicon). This affects a displacement of the majority carriers as depletion. Starting from a specific threshold voltage $U_{th}$, the displacement of the majority charge carriers is so great that they are no longer available for the recombination. An accumulation of the minority carriers appears, as a result of which the actually p-doped substrate near the insulating layer becomes n-conducting, a strong inversion. The resulting thin, n-conducting channel then connects the two n-type zones source 14 and drain 16, as a result of which charge carriers can flow from source 14 to drain 16 in a largely unimpeded fashion.

In accordance with example embodiments, the gate insulator 30 is arranged at least partly between the gate electrode 25 and the channel 20 of the p-type body region 22. The gate insulator 30 comprises a material having a hysteresis with respect to its polarization, such that a switching state of transistor 10, once produced by a voltage applied to the gate electrode 25, is maintained after the voltage has been switched off, cf. the profile of the polarization against the field strength in FIG. 1. The power transistor 10 furthermore comprises a drift zone 15. In example embodiments, the gate insulator 30 comprises at least one ferroelectric material which causes the hysteresis of the polarization behavior of the gate insulator 30.

In example embodiments, the gate insulator 30 can have different layer bundles or layer stacks that include e.g. a ferroelectric or else a plurality of different ferroelectrics, one or a plurality of SiO2 layers or else other customary insulation layers. The ferroelectric substances that can be used in the gate insulator 30 include e.g. lead zirconium titanate, barium titanate, hafnium aluminum oxide, and strontium bismuth tantalate.

In example embodiments, the gate insulator 30 is designed such that its dielectric constant decreases by more than a factor of 2 when a defined limit temperature is exceeded. In this case, typically with overtemperature, the power transistor is turned off partly or completely, depending on the design. This can be used as efficient overheating protection. The limit temperature has the effect that the power transistor can no longer be turned on until the limit temperature is undershot again. In typical applications in accordance with example embodiments, the gate insulator 30 has a limit temperature—which is simultaneously the Curie temperature—in the range of approximately 150° C. to approximately 250° C.

As already mentioned above, in example embodiments the power transistor 10 can be in principle any type of power semiconductor controlled by way of the field effect, that is to say the presence of a channel, for instance a power MOSFET, a compensation component, or an Insulated Gate Bipolar Transistor (IGBT). Typical materials for the substrate are for example (non-exhaustively) Si, SiC, and GaN.

The hysteresis of the polarization of the gate insulator 30 in accordance with embodiments generally allows power semiconductor devices 10, 11 which are switched on or turned on for driving only with a short voltage pulse at the gate electrode 25. Accordingly, the "on state" is then maintained temporarily after switch-off/the end of the pulse. It is only in the event of a further pulse with opposite voltage that the device is switched off or turned off again, since the polarization of the gate insulator produced upon switch-on is cancelled or quenched again. The states "on" and off are thus pulsed via the gate electrode 25. In contrast to conventional power FETs, therefore, the gate voltage does not have to be maintained permanently during the entire on state. The same applies to incompletely turned-on states, i.e. a voltage pulse can put the power semiconductor 10, 11 e.g. permanently into a state with partial turn-on. It is also possible to use permanent gate voltages for driving, as in conventional FETs.

In example embodiments, the power transistor 10 can be a depletion-mode transistor that is turned off when a limit temperature is exceeded. The power transistor 10 can likewise be a depletion-mode transistor that can be changed over to enhancement-mode during operation. This mode accordingly reverts to the enhancement-mode principle in the event of the Curie temperature of the gate insulator 30 being exceeded and is then permanently switched on. In order to modify this behavior, the Curie temperature can be chosen such that the reversion behavior is ruled out, that is to say that the power transistor 10 remains as a depletion-mode transistor in a constant way. The above-described overtemperature protection by the ferroelectric in the gate insulator 30 is obviated in this case. In example embodiments, JFETs, which are "normally on" components, it is thus possible to generate "normally off" components, and this can be used for instance in the case of SiC-based JFETs or GaN power components.

Figure 3:
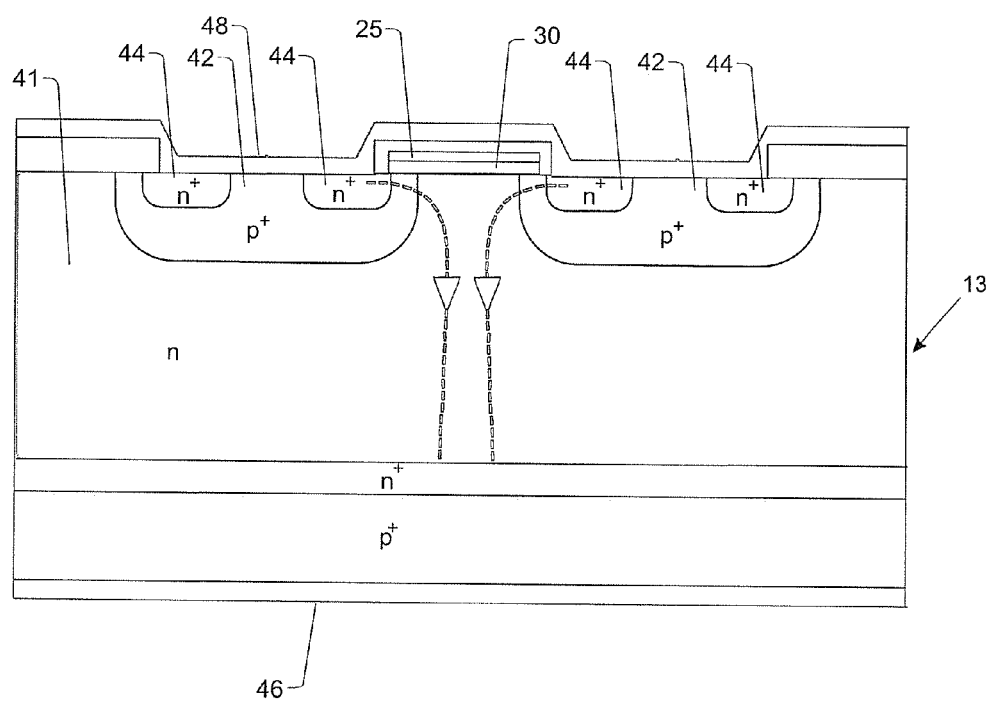

FIG. 3 shows an Insulated Gate Bipolar Transistor (IGBT) 11 in accordance with example embodiments. The IGBT 11 is controlled by means of a gate electrode 25. In example embodiments it has a homogeneous highly doped p-type substrate (n-channel IGBT) having a p-n junction specifically formed on the rear side. A weakly doped n-type epitaxial layer 41 is applied on the n-doped substrate and the p-type cathode wells 42 (optionally highly doped) and highly doped n-type islands 44 are subsequently introduced by diffusion. This gives rise to an $n^+pnp^+$ structure (see FIG. 3) for an n-channel IGBT. p-Channel IGBTs correspondingly have a $p^+npn^+$ structure. For the function of the IGBT, the p-n junction and the gate are responsible, comprising at least the gate electrode 25 and the gate insulator 30 comprising a ferroelectric in accordance with example embodiments. A positive potential is applied to the collector 46 (relative to the emitter 48), such that the rear-side junction is in forward operation and not in inverse blocking operation. Forward operation can be divided into two regions: an off-state region and an on-state region. As long as the threshold voltage (gate-emitter voltage, UGE) of the FET is not reached, the IGBT is in blocking operation. If the voltage UGE is increased, the IGBT attains the on-state region. A conducting n-channel falls below the gate in the p-type cathode well 42 as in the case of normal MIS field effect transistors. The channel enables electrons to be transported from the emitter 48 into the n-type epitaxial layer 41. Since the rear-side p-n junction is forward-biased, holes are injected into the n-type epitaxial layer 41 from the p+-type substrate, and this gives rise to an electron-hole plasma which provides for the actual conduction. Said plasma has to be established or removed upon each changeover process, thereby giving rise to higher switching losses than in the case of a power MOSFET. When said plasma is removed, the situation in which the IGBT momentarily turns on again can also occur. The use of the gate insulator 30 comprising a ferroelectric makes it possible for a switching state to be maintained after the voltage at the gate electrode has been switched off.

Figure 4:
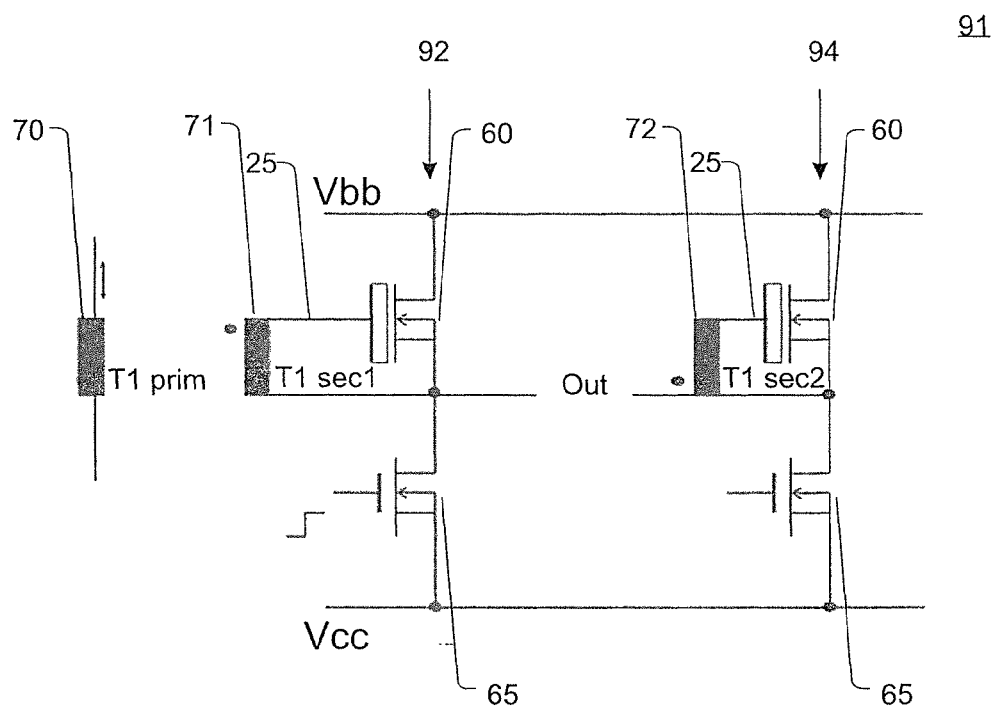
FIGS. 4 and 5 show schematic circuits with field effect semiconductor components, in accordance with embodiments.

In accordance with example embodiments, a bridge circuit 91 comprising two half-bridges 92 and 94 is proposed, the bridge circuit being shown by way of example in FIG. 4, comprising respectively one high-side transistor 60 and one low-side transistor 65, wherein the high-side transistors 60 both comprise the features of all of the power transistors 10, 11 described with reference to FIG. 2 or FIG. 3. In this case, the gate electrode 25 of the high-side transistor 60 is driven via the secondary sides 71, 72 of an electrical transformer 70, with a clocking $T1_{prim}$. The high-side transistors 60 are not finely clocked as switches, in contrast to the low-side transistors 65, and are therefore particularly suitable for this application.

In the case of application of a power transistor 10, 11 in accordance with example embodiments in such a bridge circuit 91 (comprising two half-bridges 92, 94), no dedicated voltage need be generated here in the case of the upper, high-side transistors 60. A conventionally customary charge pump (bootstrap) or dedicated drive electronics, and a galvanically isolated dedicated power supply that is otherwise possibly required for the driving of the high-side transistors 60 are therefore obviated. The devices typically having high dielectric strength such as, for example, optocouplers in the drive electronics for the upper gate circuit can also be omitted in favor of the simple transformer 70.

Figure 5:
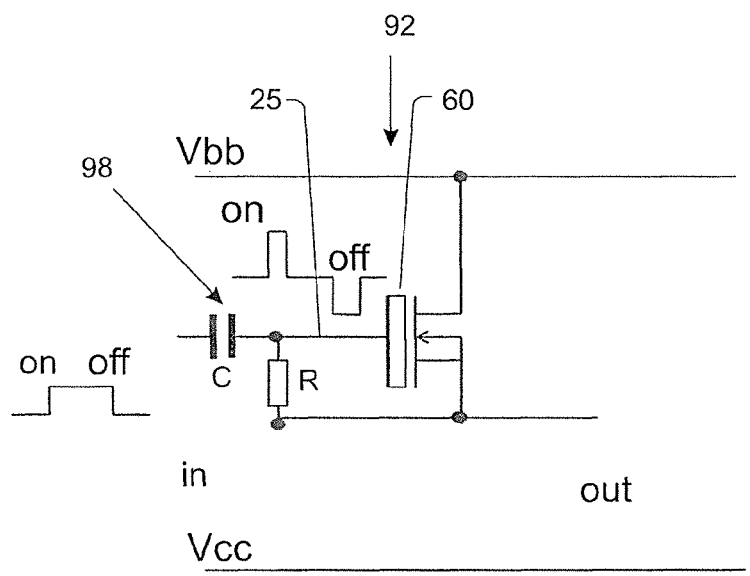
Figure 6:
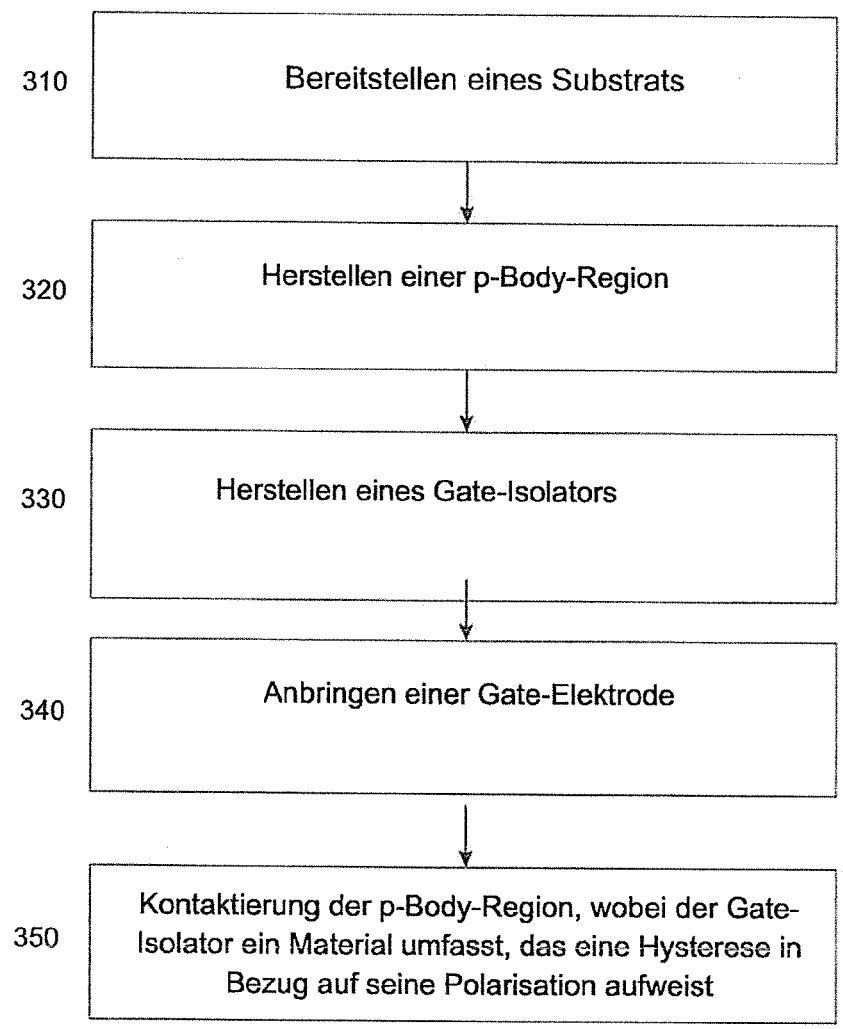
FIG. 6 shows a schematic illustration of a production method in accordance with embodiments.

FIG. 5 shows the application of a power transistor 10, 11 in accordance with example embodiments as a high-side transistor 60 (in a half-bridge 92, 94, shown only as an exit). In example embodiments, only two components are used here for the driving of the gate electrode 25, a resistance R and a capacitance C (RC element 98). With short voltage pulses having different polarities (see illustration of the voltage profile at the gate electrode in FIG. 5 above the gate electrode 25), it is thus possible to switch over between a "permanently on" and "permanently off" state. The length of the voltage pulses depends on the properties of the power device; theoretically they need only be long enough that the desired polarization of the gate insulator 30 is attained, for instance that which is necessary for full turn-on. The resulting turn-on behavior of the circuit in FIG. 5 in accordance with the above pulse profile is illustrated on the left in the figure in the on-off diagram. The first voltage pulse at the gate electrode 25 brings about the switching into the turned-on on state, and the latter second, negative pulse at the gate electrode 25 brings about the turn-off or switching into the "off state". In accordance with example embodiments, pulse or clocked pulse drive circuits are proposed for power transistors 10, 11 in accordance with embodiments, a plurality of which have been described by way of example with reference to FIG. 4 and FIG. 5. It is readily apparent to the person skilled in the art that even further embodiments and modifications of such drive circuits are possible, which generate from (short) control pulses permanent switching states in power semiconductors according to the disclosure. The latter are likewise regarded as being associated with this disclosure.

Drive circuits in accordance with embodiments typically have the property that a permanent switching state of the power semiconductor is produced by a voltage in the form of a voltage pulse being momentarily applied to the gate electrode 25 of a power semiconductor 10, 11. In this case, a first voltage pulse having a first polarity switches the power semiconductor 10, 11 into a permanent, at least partly turned-on state. This state is maintained until a second voltage pulse having inverse polarity with respect to the first polarity partly or completely cancels the degree of turn-on. In this case, the degree of turn-on and later the reduction thereof are typically controllable by the amplitude of the first and second voltage pulses. Depending on the area of application, other temporal profiles are also possible; in this regard, by way of example, a first short pulse could turn on the power semiconductor to the extent of 25%, wherein after a certain time a further pulse having an identical polarity brings about turn-on to the extent of 50% or 100%. Typical pulse durations are dependent, inter alia, on the type and dimensioning of the power semiconductor 10, 11 and the type of drive circuit. In particular, as a result, it is possible to control a switch-on or -off behavior or the switch-on or -off current edges by means of the duty ratio and/or the pulse sequence of the driving. In conventional components with conventional drive concepts, the switching edges are generally set by gate resistances, usually fixedly incorporated, upstream of the gate electrode. In contrast to conventional concepts of transistor driving, the switching edges for different operating states in example embodiments can be optimally set or optimized in the course of operation by means of the duty ratio and/or the pulse sequence of the driving. In this regard, the adaptation possibility for the control of a half-bridge circuit or bridge circuit, is improved by virtue of additional degrees of freedom or parameters arising as possibilities for influencing the control. Consequently, the operation of the circuit or parameters of the driving of the power semiconductors can be adapted in the course of operation, for instance, and can be adapted to external parameters and operating conditions and can be optimized.

A power field effect transistor in accordance with example embodiments can be manufactured, in principle, according to the known standard methods associated with the respective type, wherein at least one ferroelectric substance is applied in addition or else as an alternative to the conventional gate insulator materials during the production of the gate insulator 30. The substance is typically adjacent to or else in contact with the gate electrode 25. The typical steps include, in one example embodiment: providing a substrate and producing a source 14 and a drain 16. The p-type body region 22 is situated between source and drain. The gate insulator 30 is applied to the p-type body region 22, possibly with an insulating layer 35 such as an oxide. The gate electrode 25 is provided on the gate insulator 30. As described with reference to FIG. 1, for example, in this case the gate insulator 30 comprises a ferroelectric material. The latter can be one of lead zirconium titanate, barium titanate, hafnium aluminum oxide, and strontium bismuth tantalate, in particular at least one of $SrBi_2Ta_2O_9$, $(HfO_2)_x(Al_2O_3)_{1-x}$, Hf—Al—O and $HfO_2$, or a combination of the aforementioned.

A method 300 for producing a power field effect transistor 10 comprises providing a substrate 12 in a block 310, producing a p-type body region 22 in a block 320, producing a gate insulator 30 in a block 330, fitting a gate electrode 25 in a block 340, contacting the p-type body region 22 in a block 350, wherein the gate insulator 30 comprises a material having a hysteresis with respect to its polarization.

Although various example embodiments of the disclosure have been disclosed, it will be obvious to the competent person skilled in the art that various changes and modifications can be made, with which some of the advantages of the disclosure are achieved, without thereby departing from the essence and scope of the disclosure. Furthermore, it is evident to the person of average skill in the art that other component parts which fulfill the same functions can be correspondingly exchanged. It should be pointed out that features explained with reference to a specific figure can be combined with features of other figures, specifically even in such cases in which this is not expressly mentioned. Such modifications of the inventive concept are intended to be concomitantly encompassed by the appended claims.

Spatially relative terms such as "under", "below", "lower", "above", "upper" and the like are used in the interest of a better description in order to set out the relative positioning of an element in relation to a second element. These terms are intended to encompass different orientations of the components besides the various orientations described in the figures. Furthermore, expressions such as "first", "second" and the like are also used in order to describe different elements, zones, regions, etc., and are likewise not intended to be restrictive. Throughout the description, identical terms relate to identical elements.

In the present usage, the terms "have", "contain", "include", "comprise" and the like are terms kept open which indicate the presence of specified elements or features but do not preclude additional elements or features. The articles "a(n)" and "the" are intended to encompass both the plural and the singular, unless clearly indicated otherwise in the context.

In view of the above range of variation and application, it should be assumed that the present disclosure is restricted neither by the previous description nor by the accompanying drawings. Instead, the present disclosure is restricted exclusively by the following claims and the legal equivalents thereof.

What is claimed is:

1. A transistor, comprising:
   a drain region having a first conductivity type,
   a body region having a second conductivity type disposed in a portion of the drain region and forming a lateral interface and a vertical interface with the drain region,
   a source region having the first conductivity type formed in the body region and defining a channel disposed in the body region between the source and the lateral interface,
   a gate electrode, and
   a gate insulator,
   wherein the gate insulator is arranged at least partly between the gate electrode and the channel and is disposed over the channel, and wherein the gate insulator comprises a material having a hysteresis with respect to its polarization, such that a switching state of the transistor produced by a voltage applied to the gate electrode is maintained after the voltage has been switched off,
   wherein the first conductivity type and the second conductivity type are different.

2. The transistor as claimed in claim 1, wherein the gate insulator comprises a ferroelectric material.

3. The transistor as claimed in claim 1, wherein the transistor remains in a state defined by a first voltage pulse at the gate electrode until a second voltage pulse, different than the first, is applied to the gate electrode.

4. The transistor as claimed in claim 1, wherein the gate insulator comprises at least one of lead zirconium titanate, barium titanate, hafnium aluminum oxide, and strontium bismuth tantalate.

5. The transistor as claimed in claim 1, wherein the gate insulator has a layer step comprising at least one of $SrBi_2Ta_2O_9$, $(HfO_2)_x(Al_2O_3)_{1-x}$, Hf—Al—O and $HfO_2$.

6. The transistor as claimed in claim 1, wherein the gate insulator is designed such that the gate insulator becomes paraelectric when a defined limit temperature is exceeded.

7. The transistor as claimed in claim 6, which is designed such that the transistor is turned off partly or completely when a defined limit temperature is exceeded, this resulting in a protective effect against overheating and/or overcurrent.

8. The transistor as claimed in claim 6, wherein the gate insulator is designed such that its dielectric constant decreases by more than a factor of 2 when a defined limit temperature is exceeded, as a result of which the transistor is turned off partly or completely and, as overheating protection, can no longer be turned on until the limit temperature is undershot again.

9. The transistor as claimed in claim 1, wherein the gate insulator has a Curie temperature in the range of approximately 150° C. to approximately 250° C.

10. The transistor as claimed in claim 1, which is a vertical power MOSFET, a compensation component, or an Insulated Gate Bipolar Transistor (IGBT).

11. A transistor as claimed in claim 1, which comprises at least one of the substances Si, SiC, and GaN.

12. The transistor as claimed in claim 1, wherein the transistor is a depletion-mode transistor which is turned off when a limit temperature is exceeded.

13. The transistor as claimed in claim 1, wherein the transistor is a depletion-mode transistor which can be changed over to enhancement-mode during operation.

14. A half-bridge circuit, comprising a high-side transistor and a low-side transistor, wherein the high-side transistor comprises:
   a drift zone,
   a channel,
   a gate electrode, and
   a gate insulator,
   wherein the gate insulator is arranged at least partly between the gate electrode and the channel and comprises a material having a hysteresis with respect to its polarization, such that a switching state of the high-side transistor produced by a voltage applied to the gate electrode is maintained after the voltage has been switched off.

15. The half-bridge circuit as claimed in claim 14, wherein the gate electrode of the high-side transistor is driven via one of: an electrical transformer, and an RC element.

16. A transistor, comprising:
   a drift zone,
   a channel,
   a gate electrode, and
   a gate insulator,
   wherein the gate insulator is arranged at least partly between the gate electrode and the channel and comprises a material having a hysteresis with respect to its polarization, such that a switching state of the transistor produced by a voltage applied to the gate electrode is maintained after the voltage has been switched off,
   wherein the gate insulator comprises, in addition to a first ferroelectric layer, at least one of the following:
      a second ferroelectric, different than the first ferroelectric layer,
      an $SiO_2$ layer, and
      an insulation layer composed of dielectric materials different than $SiO_2$.

17. The transistor as claimed in claim 16, which comprises at least one of the substances Si, SiC, and GaN.

18. The transistor as claimed in claim 16, wherein the transistor is a depletion-mode transistor which is turned off when a limit temperature is exceeded.

19. The transistor as claimed in claim 16, wherein the transistor is a depletion-mode transistor which can be changed over to enhancement-mode during operation.

* * * * *